United States Patent
Xiong et al.

(10) Patent No.: US 7,781,377 B2
(45) Date of Patent: Aug. 24, 2010

(54) ANTI-EPITAXIAL FILM IN A SUPERCONDUCTING ARTICLE AND RELATED ARTICLES, DEVICES AND SYSTEMS

(75) Inventors: Xuming Xiong, Niskayuna, NY (US); Venkat Selvamanickam, Wynantskill, NY (US); Ping Hou, Schenectady, NY (US)

(73) Assignee: Superpower, Inc., Schenectady, NY (US)

(*) Notice: Subject to any disclaimer, the term of this patent is extended or adjusted under 35 U.S.C. 154(b) by 1273 days.

(21) Appl. No.: 11/319,971

(22) Filed: Dec. 28, 2005

(65) Prior Publication Data

US 2007/0149410 A1 Jun. 28, 2007

(51) Int. Cl.
*H01L 39/24* (2006.01)
(52) U.S. Cl. ........... 505/237; 428/689; 428/699; 428/701; 505/234; 505/238
(58) Field of Classification Search ......... 505/234–238; 428/699–702
See application file for complete search history.

(56) References Cited

U.S. PATENT DOCUMENTS

| | | | |
|---|---|---|---|
| 5,236,509 A | 8/1993 | Sioshansi et al. | |
| 5,494,700 A * | 2/1996 | Anderson et al. | 427/115 |
| 5,635,730 A | 6/1997 | Sakakibara et al. | |
| 5,650,378 A | 7/1997 | Iijima et al. | |
| 6,190,752 B1 | 2/2001 | Do et al. | |
| 6,214,772 B1 | 4/2001 | Iijima et al. | |
| 6,312,819 B1 | 11/2001 | Jia et al. | |
| 6,319,326 B1 | 11/2001 | Koh et al. | |
| 6,555,256 B1 | 4/2003 | Christen et al. | |
| 6,730,410 B1 | 5/2004 | Fritzemeier et al. | |
| 6,849,580 B2 | 2/2005 | Norton et al. | |
| 6,849,583 B2 | 2/2005 | Corr et al. | |
| 6,998,028 B1 | 2/2006 | Selvamanickam et al. | |
| 7,071,149 B2 | 7/2006 | Selvamanickam | |
| 2002/0144838 A1 | 10/2002 | Fritzemeier et al. | |
| 2003/0036483 A1 | 2/2003 | Arendt et al. | |
| 2003/0144150 A1 | 7/2003 | Arendt et al. | |
| 2004/0003768 A1 * | 1/2004 | Goyal | 117/2 |
| 2004/0016401 A1 | 1/2004 | Ignatiev et al. | |
| 2004/0168636 A1 | 9/2004 | Savvides et al. | |
| 2004/0248743 A1 | 12/2004 | Norton et al. | |
| 2005/0220986 A1 | 10/2005 | Selvamanickam et al. | |
| 2006/0116293 A1 | 6/2006 | Norton et al. | |
| 2007/0238619 A1 * | 10/2007 | Xiong | 505/100 |

OTHER PUBLICATIONS

U.S. Appl. No. 11/320,104, filed Dec. 28, 2005, Xiong et al.

* cited by examiner

*Primary Examiner*—Steven Bos
*Assistant Examiner*—Paul A Wartalowicz
(74) *Attorney, Agent, or Firm*—Larson Newman & Abel, LLP

(57) ABSTRACT

A superconducting article is provided that includes a substrate, an anti-epitaxial film over the substrate, a buffer film having biaxial crystal texture over the anti-epitaxial film, and a superconductor layer over the second buffer film. Also provided is a superconducting article as a tape, in a power cable, and a power transformer.

16 Claims, 4 Drawing Sheets

US 7,781,377 B2

ANTI-EPITAXIAL FILM IN A SUPERCONDUCTING ARTICLE AND RELATED ARTICLES, DEVICES AND SYSTEMS

BACKGROUND

1. Field of the Disclosure

The invention relates to superconducting articles, devices and systems made therefrom, including superconductor tapes and devices.

2. Description of the Related Art

Superconductor materials have long been known and understood by the technical community. Low-temperature (low-$T_c$) superconductors exhibiting superconductive properties at temperatures requiring use of liquid helium (4.2 K) have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters. In addition, other benefits of high-temperature superconductors in the power industry include a factor of 3-10 increase of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

One of the more difficult challenges in creating commercially viable second generation-tapes has been the creation of a biaxially textured HTS layer. Good crystallographic biaxial texture is critical for HTS conductors to obtain high critical current ($I_c$) performance. The usual way to achieve the desired biaxial texture, is epitaxial growth on oriented substrate such as single crystal substrate, such as epitaxial growth of YBCO on single crystal (001) STO.

However, in order to fabricate inexpensive and flexible HTS tape for various applications, single crystal oxide substrate can not be employed, and accordingly, polycrystalline metal tape (usually <0.2 mm in thickness) have been employed as the substrate is the choice. In order to get sharp biaxial texture of HTS layer (low mosaic spread), a buffer with good biaxial texture film must be formed as the buffer upon metal tape substrate, and then the HTS layer can epitaxially grow upon the biaxially-textured buffer to obtain the desired biaxial texture.

Iijima et al., (U.S. Pat. No. 5,650,378) describes a biaxially-textured YSZ buffer layer deposited upon a polycrystalline substrate by ion beam assisted deposition (IBAD), in which an energetic, collimated ion beam is used to bombard the growing YSZ film to align the growing YSZ grains along the ion beam direction. Many researchers joined to work on this technique and showed YBCO film growing upon this textured YSZ shows excellent superconducting properties and IBAD YSZ is a robust process. However, the mechanism of forming a biaxially-textured YSZ is thought to be growth-competition based, so thick (~1000 nm) YSZ film is required to obtained sharp texture. Accordingly, IBAD YSZ processing has been considered to be too slow for commercial production.

Wang et al. (U.S. Pat. No. 6,190,752) discloses that a biaxial texture can be formed with about 10 nm MgO by IBAD upon smooth amorphous surfaces. Accordingly, the IBAD MgO process can be much faster than IBAD YSZ process, and represents improved commercial feasibility. This biaxial texture at such a thin thickness is due to a different mechanism from the mechanism in IBAD YSZ. The quick texturing of IBAD MgO takes place during the nucleation stage during IBAD, and is not a growth-competition process as in IBAD YSZ. Wang et al. teach that in order to achieve quick texturing, a rock-salt-like material must be deposited on an amorphous substrate. However, it has been discovered that not any rock-salt-like material deposited on amorphous substrate of any material can achieve a biaxial texture, and in fact, in practice, only MgO on amorphous $Si_3N_4$ surfaces can obtain satisfactory biaxial texture upon nucleation. But due to instability of $Si_3N_4$ at a high temperature and high $O_2$ environment required for HTS film deposition, $I_c$ performance has been discovered to be quite poor.

Arendt et al. (U.S. Patent Application 2003/0144150) teach that an amorphous surface is not a necessity for biaxial-textured IBAD MgO, and that a good biaxial texture of IBAD MgO can also be obtained on nano-crystalline $Y_2O_3$ and with wider deposition window. Arendt et al. teach a textured rock-salt-like oxide upon crystalline oxide or oxynitride surface. As described above, not any rock-salt-like material may be deposited on crystalline substrate to obtain a suitable nucleation stage biaxial texture, in fact, in practice, only MgO on crystalline $Y_2O_3$ surfaces has been discovered to be able to obtain satisfactory biaxial texture other requirements as a buffer layer for the HTS conductor.

In an effort to develop an HTS conductor, there is a strong desire to have more choices on available biaxially-textured thin buffer beyond IBAD MgO on $Y_2O_3$ or amorphous $Si_3N_4$. The need for additional materials and processing pathways is also because IBAD MgO processing is a very delicate and difficult to control, especially compared to IBAD YSZ processing. For example, IBAD MgO processing places a high demand on smoothness (<1 nm) of $Y_2O_3$, the underlying template surface (also referred to as a nucleation seed layer). Degraded smoothness of the nucleation seed layer results in poor texture or even no texture. Another problem with processing IBAD MgO on $Y_2O_3$ is that the IBAD MgO has a very narrow optimal thickness range; as MgO thickness grows, the out-of-plane orientation changes to (111) or (110) and in-plane texture is destroyed. The parameter of atom to ion arrival ratio for IBAD MgO processing also has a very narrow window that is not wanted in large scale production of commercialization of HTS conductors.

Still further, in order to make a thin (e.g., 10 nm) IBAD MgO robust, a home-epitaxial MgO layer (~30-80 nm) has to be grown on the IBAD MgO layer. As a drawback, $I_c$ is very sensitive to the quality of the homo-epitaxial MgO, pacing stringent process controls on growth of this homo-epitaxial MgO. In addition, MgO has large lattice mismatch with the HTS layer (typically YBCO), so a cap layer, usually $SiTiO_3$ has to be grown between MgO and YBCO. In addition to all these layers (at least four), generally a barrier such as $Al_2O_3$ is needed to prevent diffusion of metal elements from the substrate into the HTS layer, and to prevent oxidation of the metal substrate. Accordingly, in practice, the net structure of IBAD MgO/$Y_2O_3$ seed layer is undesirably complex, and difficult to process in a reproducible manner, especially in a large scale production setting. Accordingly, there is desire to reduce the number of layers in buffer stack to make processing less complex and reliable.

Accordingly, in view of the foregoing, there is a need in the art for improved superconductors, devices and systems incorporating such devices. In particular, there is a need for new superconducting structures having improved processability, and processes for forming commercially viable superconducting articles, such as alternative techniques of creating a biaxially textured HTS layers. In addition, further improvements in process windows for HTS conductor fabrication, additional material choices with better properties, particularly with respect to the interaction between the nucleation seed layer and IBAD textured layer, have been recognized by the present inventors as particular needs in the industry for commercialization of HTS conductors.

SUMMARY

According to one aspect of the disclosed superconducting article, a substrate with an overlying an anti-epitaxial film is provided. A buffer film overlies the anti-epitaxial film and the buffer film has a biaxial texture. In addition, a superconducting layer overlies the buffer film.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
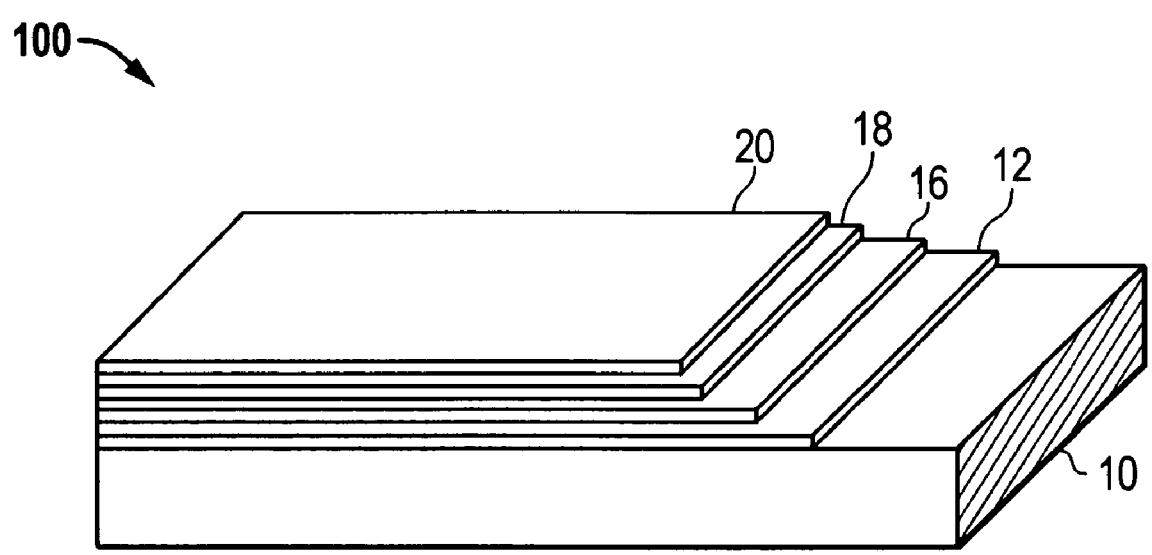
FIG. 1 illustrates a perspective view showing the generalized structure of a superconducting article according to an embodiment of the present invention.

Turning to FIG. 1, the general layered structure of a superconducting article according to an embodiment is depicted. The superconducting article includes a substrate 10, a buffer layer 12 overlying the substrate 10, and a superconducting layer 16. Optionally, the superconducting article can also include a capping layer 18 over the superconducting layer, which typically includes a noble metal layer. The superconducting article can optionally include a stabilizer layer 20, which typically includes a non-noble metal.

The substrate 10 is generally metal-based, and typically, an alloy of at least two metallic elements. Particularly suitable substrate materials include nickel-based metal alloys such as the known Inconel® group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductor tape fabrication, which typically will utilize reel-to-reel tape handling.

In one embodiment, the substrate 10 is in a tape-like configuration, having a high dimension ratio. For example, the width of the tape is generally on the order of about 0.4 to 10 cm, and the length of the tape is typically at least about 100 m, most typically greater than about 500 m. Indeed, embodiments of the present invention provide for superconducting tapes that include substrate 10 having a length on the order of 1 km or above. Accordingly, the substrate can have a dimension ratio which is fairly high, on the order of not less than 10, not less than about $10^2$, or even not less than about $10^3$. Certain embodiments are longer, having a dimension ratio of $10^4$ and higher. As used herein, the term "dimension ratio" is used to denote the ratio of the length of the substrate or tape to the next longest dimension, the width of the substrate or tape.

Furthermore, the substrate can be treated so as to have desirable surface properties for subsequent deposition of the constituent layers of the superconductor tape. For example, the surface may be lightly polished to a desired flatness and surface roughness.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of an superconductor layer having desirable crystallographic orientation for superior superconducting properties. Magnesium oxide is a typical material of choice for the IBAD film, and may be on the order or 50 to 500 Angstroms, such as 50 to 200 Angstroms. In one embodiment, the IBAD film has a rock-salt like crystal structure, as defined and described in U.S. Pat. No. 6,190,752, incorporated herein by reference.

The superconducting layer 16 is generally in the form of a high-temperature superconducting (HTS) layer. HTS materials are typically chosen from any of the high-temperature superconducting materials that exhibit superconducting properties above the temperature of liquid nitrogen, 77 K. Such materials may include, for example, $YBa_2Cu_3O_{7-x}$, $Bi_2Sr_2Ca_2Cu_3O_{10+y}$, $Ti_2Ba_2Ca_2Cu_3O_{10+y}$, and $HgBa_2Ca_2Cu_cO_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconducting layer 16 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment, or chemical solution method such as MOD method can be used. Typically, the superconducting layer 16 has a thickness on the order of about 1 to about 30 microns, most typically about 2 to about 20 microns, such as about 2 to about 10 microns, in order to get desirable amperage ratings associated with the superconductor layer 14.

The capping layer 18 and the stabilizer layer 20 are generally implemented to provide a low resistance interface and for electrical stabilization to aid in prevention of superconductor burnout in practical use. More particularly, layers 18 and 20 aid in continued flow of electrical charges along the superconductor in cases where cooling fails or the critical current density is exceeded, and the superconductor layer moves from the superconducting state and becomes resistive. Typically, a noble metal is utilized for capping layer 18, to provide ohmic connection with the overlying stabilizer and to prevent unwanted poisoning of the superconductor layer as in the case of high temperature processing in which stabilizer atoms might migrate into the superconductor layer 14. Typical noble metals include gold, silver, platinum, and palladium. Silver is typically used due to its cost and general accessibility. The capping layer 18 is typically made to be thick enough to provide good protection of superconductor during the coating of stabilizer 20, but is made to be generally thin for cost reasons (raw material and processing costs). Typical thicknesses of the capping layer 18 range within about 0.1 to about 10.0 microns, such as 0.5 to about 5.0 microns. Various techniques may be used for deposition of the capping layer 18, including physical vapor deposition, such as DC magnetron sputtering.

Figure 2:
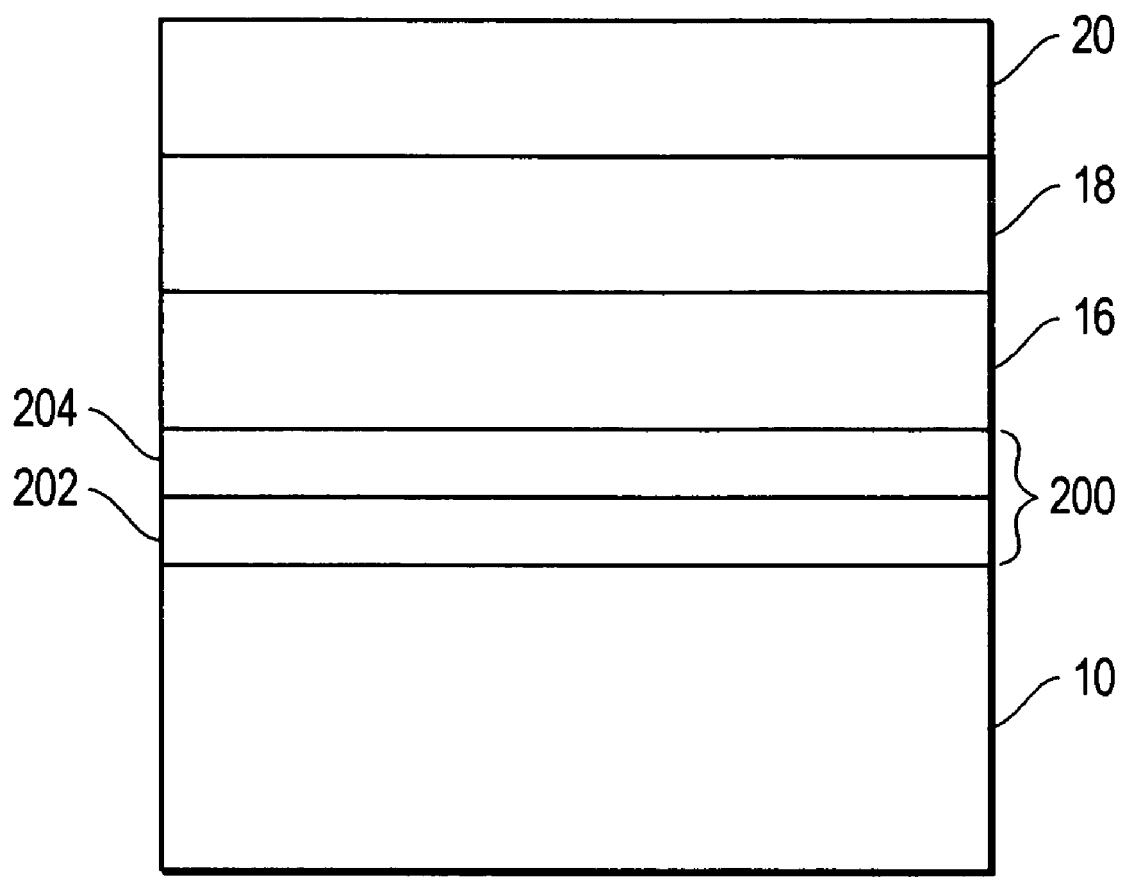
FIG. 2 illustrates a cross sectional view showing the generalized structure of a superconducting article according to an embodiment of the present invention.

The stabilizer layer 20 is generally incorporated to overlie the superconducting layer 16, and in particular, overlie and directly contact the capping layer 18 in the particular embodiment shown in FIG. 1. The stabilizer layer 20 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating. In this regard, the capping layer 16 may function as a seed layer for deposition of copper thereon Turning to FIG. 2, a cross section of the layers of a superconducting article is illustrated. According to one embodiment, as illustrated, the buffer layer 200 includes an anti-epitaxial film 202 overlying the substrate and a buffer film 204 overlying the anti-epitaxial film 204. As used herein, the term "anti-epitaxial" means that the overlying film cannot be epitaxially grown on the anti-epitaxial layer at the conditions under which the overlying textured layer is deposited. Stated alternatively, the anti-epitaxial layer has no or little effect on the orientation of the grains of the overlying film growing on it. Here, the orientation of the grains of the overlying buffer film is determined by its own properties, such as minimum free energy plane, charge balance plane, or by external forces such as ion beam bombardment, rather than influence from the underlying anti-epitaxial film. That is, the anti-epitaxial film has a crystallographic or chemical mismatch that is sufficient to prevent growth by epitaxy of the overlying film. Crystallographic mismatch may be manifested in different ways, for example, lattice constant mismatch, lattice symmetry mismatch, lattice parameter mismatch, discussed in more detail below.

In one embodiment the anti-epitaxial film 202 is uniaxially textured. The uniaxial texture of the anti-epitaxial film 202 exists out-of-plane, which is normal to the plane of the substrate. In a particular embodiment, the uniaxial crystal texture of the anti-epitaxial film 202 in the out-of-plane direction without significant texture in-plane.

According to a particular embodiment, the anti-epitaxial film has a grain size not less than about 10 nm, such as not less than about 20 nm, 50 nm, or even larger, such as not less than about 100 nm. Such relatively large grain sizes may be particularly suitable for certain applications and may aid in the formation of an effective anti-epitaxial layer.

As used herein, the term "texture" refers to a grain-to-grain crystallographic misorientation of the respective film known and quantified as "mosaic spread". Typically, the mosaic spread for the anti-epitaxial film is less than about 30°, such as less than about 20°, 15°, 10°, or 5°, but is generally finite typically being greater than about 1°. According to the embodiments discussed above, the term "without significant texture," generally refers to a mosaic spread of the film being greater than about 30° and including generally random polycrystalline arrangements.

According to a particular feature of the embodiment described above, the uniaxial texture of the material forming the anti-epitaxial film is of a sufficient quality (low mosaic spread) and orientation to ensure that the final surface presented for growth of the next overlying layer (typically the biaxially textured film) has a non-templating effect. A uniaxial texture can help assure that a random crystal grain does not take on an orientation that results in local templating of the next layer, which is likely to negatively impact the desired biaxial texture of the overlying layer.

According to one embodiment, the uniaxial crystal texture of the anti-epitaxial film 202 is achieved by ion-beam assisted deposition (IBAD). While IBAD has been utilized in connection with second generation HTS tape production it has been typically reserved for forcing a particular biaxial crystal structure. Here, it is used to force a uniaxial crystal structure in the anti-epitaxial film, generally having the anti-templating properties discussed above.

According to one embodiment, the anti-epitaxial film 202 comprises a crystalline material that has a large lattice mismatch with the buffer film 204, such that reproduction of the crystal structure of the anti-epitaxial film 202 through epitaxial growth is prevented in the buffer film 204. According to one embodiment, the lattice mismatch between the anti-epitaxial film 202 and the buffer film 204 is not less than about 12%, preferably larger than 20%, and in some cases larger than about 30%. Providing a suitable anti-epitaxial film material having the proper lattice.

Mismatch depends in part upon the material comprising the buffer film 204. For example, in one embodiment the buffer film 204 comprises MgO. In such a case, suitable uniaxially textured anti-epitaxial film materials to include, $Y_2O_3$, AlON, $Eu_2O_3$, $Er_2O_3$, $Gd_2O_3$, $Tb_2O_3$, $Sc_2O_3$, $Sm_2O_3$, $Gd_2O_3$, $LaAlO_3$ or combinations of these materials In another embodiment, the anti-epitaxial film 202 comprises a crystalline material that has different surface lattice symmetry with the surface lattice symmetry of the buffer film 204 to prevent epitaxial growth in the buffer film 204. As discussed in previous embodiments, the selection of the material comprising the anti-epitaxial film 202 is determined in part by the material comprising the buffer film 204. In one embodiment, the buffer film 204 material is comprised of a rock-salt-like crystal structure, typically formed by IBAD, such as IBAD MgO, which has a four-fold surface lattice symmetry. Accordingly, the anti-epitaxial film 202 can include materials having different surface lattice symmetry, such as three-fold or two-fold surface lattice symmetry. In one embodiment the buffer film 204 includes (001) oriented IBAD MgO and the anti-epitaxial film 202 comprises of (111) oriented fluorite type material, such as yttrium stabilized zirconia (YSZ), pyrochlore-type materials such as $GdZrO_7$, and rare-earth C-type materials such as yttrium oxide. This material has (111) closed packed plane, tends to form (111) out-of-plane uniaxial-texture under thermodynamic growth conditions. Materials with hexagonal structures forming three-fold surface symmetry may be substituted for the material mentioned above if they can form unitextured film with 3 or 6 fold symmetric surface lattice. These materials include $Al_2O_3$. Sometimes, material, which can form unitextured film with two-fold symmetric surface lattice can also be used as anti-epitaxy layer.

In another embodiment, the anti-epitaxial film 202 is comprised of a non-cubic material that has lattice parameters a, b, and c, wherein the difference between the values of any two of the lattice parameters is not less than about 20%, preferably not less than 30%.

In another embodiment, the anti-epitaxial film 202 is comprised of a material having triclinic or monoclinic crystal structure where the angles between the lattice planes are non-orthogonal by at least 5°, preferably by at least 10°. It is preferable that the anti-epitaxial film 202 material is comprised of a material with both large difference between a, b, c lattice constants as described above and having a triclinic or monoclinic structure. Suitable materials include base centered monoclinic structure such as gadolinium oxide, terbium oxide, scandium oxide, samarium oxide, zirconium oxide, holmium oxide, praseodymium oxide, promethium oxide, dysprosium oxide, thulium oxide, lutetium oxide, ytterbium oxide and neodymium oxide. Other monoclinic materials such as titanium oxide, vanadium oxide, niobium oxide, chromium oxide, and orthogonal structured material such as bismuth oxide may also be utilized.

According to one embodiment, the anti-epitaxial film 202 comprises a crystalline material having a large surface relaxation characteristic to prevent epitaxial growth in the buffer film 204. A "large surface relaxation" is defined as a change in crystal structure from the bulk material to the surface, for example, under surface relaxation. For some materials, the resulting surface lattice constants can be more than two times its bulk lattice constants, and the resulting surface lattice symmetry changes from cubic structure to monoclinic structure. This phenomena provides an anti-epitaxy relationship between anti-epitaxy film and buffer film.

Turning to the buffer film 204, the film is typically biaxially textured, meaning the film has a crystalline texture that is generally aligned along both axes, both in-plane and out-of-plane of the film. Such biaxial texturing may be accomplished by IBAD. As is understood in the art, magnesium oxide is a typical material of choice for the buffer film 204, and may be on the order or 50 to 500 Angstroms, such as 50 to 200 Angstroms. Presently, as in U.S. Pat. No. 6,190,752, and US Patent Publication 2003/0144150, this IBAD buffer film is claimed to have to be a rock-salt like crystal structure. However, according to embodiments herein, the present buffer film may be composed of a material including, but not limited to a rock-salt-like material. A variety of materials that have an anti-epitaxial relationship with the anti-epitaxial film and which meets other requirements during later processing of the HTS conductor, may be utilized.

One embodiment of the biaxial buffer film comprises of non-cubic structured material with (001) lowest free energy or (100) close-packed planes. Examples include, but are not limited to tetragonal structured materials such as rutile (TiO2) or anatase $TiO_2$, rhombohedral structured materials like $LaAlO_3$, or layer-structured material like YBCO.

Another embodiment of a biaxial buffer film comprises of non-rock-salt-like material with (001) charge balanced plane. The charge balanced crystal plane is the crystal plane within which the total negative charges from negative ions are roughly same as the total positive charges from positive ions. One example of such material is the rutile structure-material, including $TiO_2$, $SnO_2$, $RuO_2$, which has charge balance plane along (001) plane.

In one aspect, a buffer film is disposed on the anti-epitaxial film, the buffer film having a biaxial crystal texture. By definition, the biaxially textured buffer film has both in-plane and out-of-plane crystal texture. As defined herein, a "biaxially textured film" is a polycrystalline material in which both the crystallographic in-plane and out-of-plane mosaic spread of the topmost portion is less than about 30 degrees, such as less than about 20°, 15°, 10°, or 5°, but is generally finite typically greater than about 1°.

The buffer film 204 is a layer in which biaxial texture is generally induced due to ion beam assisted deposition. The buffer film 204 generally has a thickness within a range of about 50 to about 5000 Angstroms. The biaxially textured buffer film 204 preferably has (001) out-of-plane orientation. The buffer film 204 can have a rock-salt-like crystal structure such as MgO, NiO or can include YSZ, $CeO_2$, $Y_2O_3$, $TiO_2$, $SnO_2$, $Mn_3O_4$, $Fe_3O_4$, $Cu_2O$, or $RE_2O_3$, wherein RE is a rare earth element.

Beyond the particular architecture and process techniques in connection with superconducting articles such as tapes as described above, embodiments are also directed to components, such as industrial or commercial power components incorporating such conductors. Certain embodiments are drawn to power cables, a class of power components known as "rotating machines," which broadly includes power generators and motors, and other embodiments are drawn to transformers.

Figure 3A:
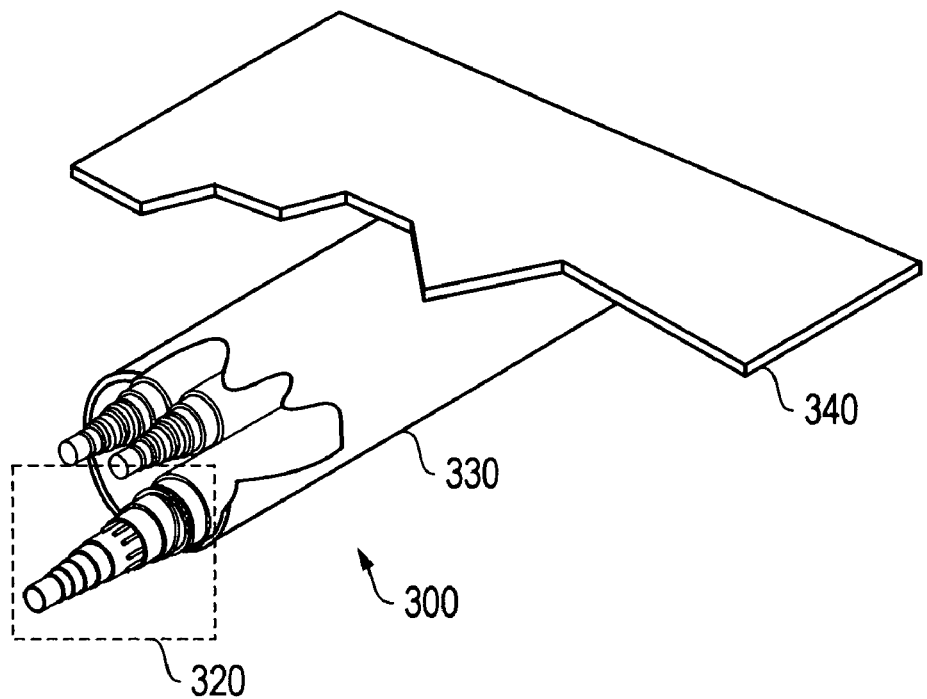
FIG. 3A illustrates an embodiment of the superconducting article as used in a cable.

FIG. 3A illustrates a power cable 300, according to an embodiment of the invention. Power cable 300 shown includes three superconducting cables or tapes 320 arranged in a trefoil arrangement where all three phases are housed in the same thermally insulating conduit 330. Ground plane 340 is also shown. The phases are generally situated as close together as physically possible. Although not shown, other arrangements are possible, including a concentric arrangement where the 3 cables are situated concentrically.

Figure 3B:
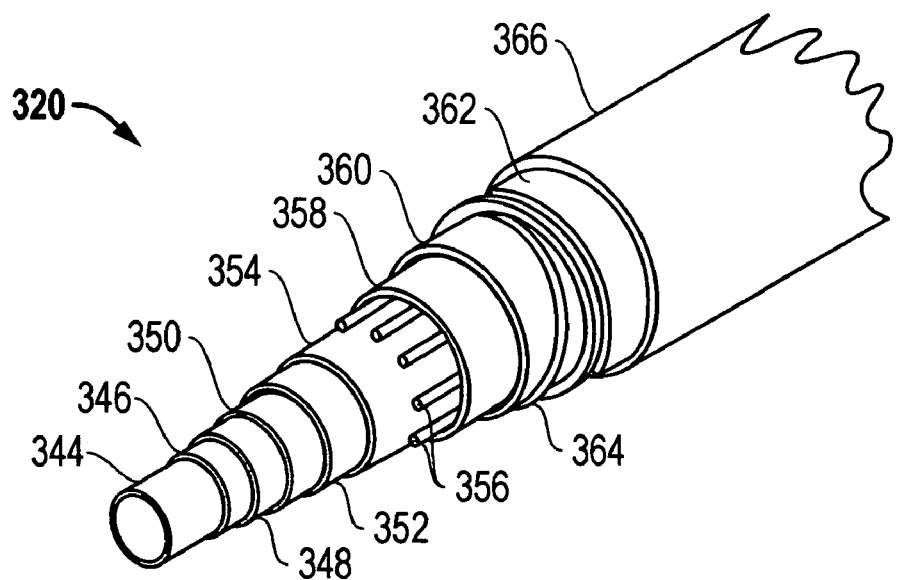
FIG. 3B illustrates an embodiment of the superconducting article as used in a cable.

FIG. 3B shows details of a single exemplary superconducting cable 320. Proceeding from the outside to the inside, cable 320 includes enclosure 366, skid wires 364, corrugated steel 362 and thermal insulator 360. $LN_2$ duct 358 provides refrigerant to cable 320 and is disposed on centering wires 356. Copper shield 354 is provided and is disposed on superconductor tape layer 352. Dielectric tape 350 is disposed between tape layer 352 and copper shield 348. Another superconductor tape layer 346 is beneath copper shield 348. Former/duct 344 provides a passage of coolant fluid, such as liquid nitrogen ($LN_2$) refrigerant, which permits cost-effective cooling to temperatures above the freezing point for nitrogen (which is at about 63.3 K). The power cable 300 can form a power transmission cable or a power distribution cable.

Figure 4:
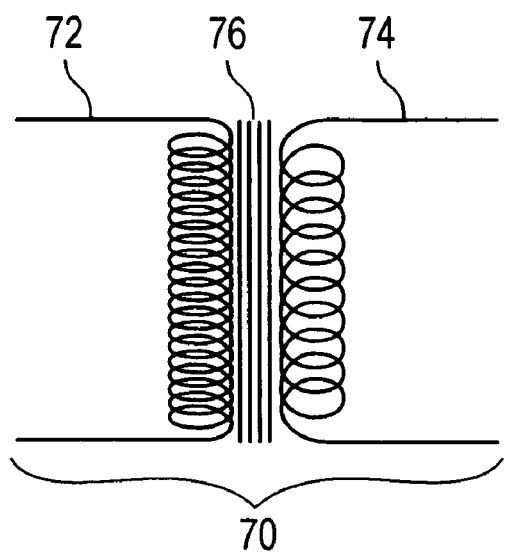
FIG. 4 illustrates a schematic view of a transformer.

FIG. 4 illustrates schematically a power transformer having a central core 76 around which a primary winding 72 and a secondary winding 74 are provided. It is noted that FIG. 4 is schematic in nature, and the actual geometric configuration of the transformer may vary as is well understood in the art. However, the transformer includes at least the basic primary and secondary windings. In this regard, in the embodiment shown in FIG. 4, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive tapes in accordance with the foregoing description.

Figure 5:
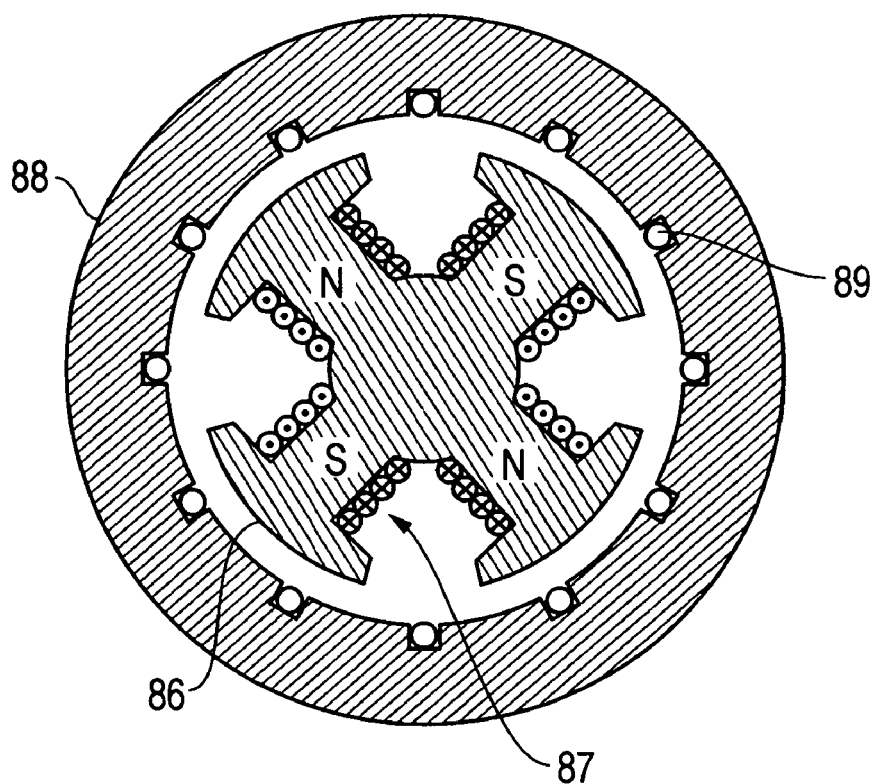
FIG. 5 illustrates a schematic view of a power generator.

Turning to FIG. 5, the basic structure of a generator is provided. The generator includes a rotor 86 that is driven as is known in the art, such as by a turbine. Rotor 86 includes high-intensity electromagnets, which are formed of rotor coils 87 that form the desired electromagnetic field for power generation. The generation of the electromagnetic field generates power in the stator 88, which comprises at least one conductive winding 89. According to a particular feature of the embodiment, the rotor coils and/or the stator winding comprises a superconductive tape in accordance with embodiments described above.

According to embodiments herein, reproducible superconducting articles have been provided having exemplary texture in the characteristic buffer layer enabling exemplary texture in the superconducting layer. Embodiments obviate the need to rely on amorphous surfaces on which biaxially textured buffer films are grown, and further, represents a fundamental shift from prior work disclosed in U.S. Pat. No. 6,489,580. Which utilizes a uniaxial templating film on which a biaxial film is epitaxially grown.

While particular aspects of the present invention have been described herein with particularity it is well understood that those of ordinary skill in the art may make modifications hereto yet still be within the scope of the present claims. The previously mentioned embodiments and examples, in no way limit the scope of the following claims.

What is claimed is:

1. A superconducting article comprising:
   a substrate;
   a crystalline anti-epitaxial film overlying said substrate, the anti-epitaxial film has a uniaxial texture along an out-of-plane direction generally aligned along the [111] crystal direction;
   a buffer film overlying the anti-epitaxial film, said buffer film having a biaxial crystal texture with the <001> orientation along an out-of-plane direction; and
   a superconductor layer overlying said buffer film.

2. The superconducting article of claim 1, wherein said biaxial crystal texture has an out-of-plane mosaic spread no greater than about 30 degrees.

3. The superconducting article of claim 1, wherein the crystalline anti-epitaxial film has an average grain size not less than 10 nm.

4. A superconducting article comprising:
   a substrate;
   a crystalline anti-epitaxial film overlying said substrate;
   a buffer film overlying the anti-epitaxial film, said buffer film having a biaxial crystal texture; and
   a superconductor layer overlying said buffer film;
   wherein an in-plane lattice symmetry of the anti-epitaxial film is three fold symmetry and an in-plane symmetry of the buffer film is four fold symmetry.

5. The superconducting article of claim 1, wherein the anti-epitaxial film comprises materials having lattice parameters, a, b, and c, wherein the difference between the values of any two of the lattice parameters is not less than about 20%.

6. The superconducting article of claim 5, wherein the anti-epitaxial film comprises a monoclinic or triclinic structure material having lattice planes, wherein angles between the lattice planes are non-orthogonal by more than 5°.

7. The superconducting article of claim 5, wherein the anti-epitaxial film is comprises an orthogonal structure material.

8. The superconducting article of claim 6, wherein the anti-epitaxial film is comprises a base-centered monoclinic structured material.

9. The superconducting article of claim 1, wherein the anti-epitaxial film comprises at least one material from the group consisting of gadolinium oxide, terbium oxide, scandium oxide, samarium oxide, titanium oxide, vanadium oxide, niobium oxide, chromium oxide, zirconium oxide, neodymium oxide, holmium oxide, praseodymium oxide, promethium oxide, dysprosium oxide, thulium oxide, lutetium oxide, ytterbium oxide, and bismuth oxide.

10. The superconducting article of claim 1, wherein the anti-epitaxial film comprises a material with surface relaxation, surface relaxation being a difference in the lattice structure between a bulk and a surface such that the surface of anti-epitaxial film over which the buffer film lies has anti-epitaxial relationship with the buffer film.

11. The superconducting article of claim 1, wherein said buffer film comprises a non-rock-salt-like material having a (001) charge balanced crystal plane.

12. The superconducting article of claim 1, wherein said buffer film comprises of non cubic structured material with (001) lowest free energy or (100) close-packed planes.

13. The superconducting article of claim 1, wherein said buffer film comprises at least one material from the group consisting of MgO, NiO, YSZ, $CeO_2$, $Y_2O_3$, $Mn_3O_4$, $Fe_3O_4$, $Cu_2O$, and $RE_2O_3$, wherein RE is a rare earth element, a tetragonal structured material including rutile and anatase, a rhombohedral structured material including $LaAlO_3$, and an anisotropic layer-structured material including YBCO.

14. The superconducting article of claim 1, wherein said superconductor article provides a $J_c$ of at least 0.5 MA/cm² at 77 K and self-field.

15. The superconducting article of claim 1, wherein said superconductor layer comprises $REBa_2Cu_3O_7$, wherein RE is a rare earth element.

16. The superconducting article of claim 1, wherein the superconducting article is in the form of a superconducting tape, having a dimension ratio not less than about 10.

* * * * *